United States Patent
Zama et al.

(10) Patent No.: US 6,963,676 B2
(45) Date of Patent: Nov. 8, 2005

(54) OPTICAL MODULE AND METHOD OF ASSEMBLING THE OPTICAL MODULE

(75) Inventors: Satoru Zama, Chiyoda-ku (JP); Toshio Mugishima, Chiyoda-ku (JP); Kengo Mitose, Chiyoda-ku (JP); Yoshikazu Tsuzuki, Chiyoda-ku (JP); Masato Sakata, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 44 days.

(21) Appl. No.: 10/949,280

(22) Filed: Sep. 27, 2004

(65) Prior Publication Data

US 2005/0041934 A1 Feb. 24, 2005

Related U.S. Application Data

(63) Continuation of application No. PCT/JP03/03012, filed on Mar. 13, 2003.

(30) Foreign Application Priority Data

Mar. 27, 2002 (JP) .................................... 2002-089135

(51) Int. Cl.[7] .............................. G02B 6/12; G02B 6/36
(52) U.S. Cl. ............................... 385/14; 385/88; 385/92
(58) Field of Search ............................. 385/14, 88, 92

(56) References Cited

U.S. PATENT DOCUMENTS 6,791,159 B2 * 9/2004 Moto et al. .................. 257/531

FOREIGN PATENT DOCUMENTS

| JP | 07-128550 | 5/1995 |
|---|---|---|
| JP | 11-295560 | 10/1999 |
| JP | 2000-280090 | 10/2000 |
| JP | 2000-323731 | 11/2000 |
| JP | 2001-215372 | 8/2001 |
| JP | 2002-185130 | 6/2002 |
| JP | 2002-232053 | 8/2002 |
| JP | 2002-353520 | 12/2002 |
| JP | 2003-124412 | 4/2003 |
| WO | WO 03/081734 | 10/2003 |

* cited by examiner

Primary Examiner—Frank G. Font
Assistant Examiner—Mary El-Shammaa
(74) Attorney, Agent, or Firm—Oblon, Spivak, McClelland, Maier & Neustadt, P.C.

(57) ABSTRACT

An optical module equipped with at least one optical component, a package for housing the one optical component, and a joining portion. The joining portion is formed within the package by Sn—Ag solder containing 2.0 to 5.0 wt % Ag and 2.0 to 20.0 wt % Au, or Sn—Zn solder containing 6.0 to 10.0 wt % Zn and 2.0 to 20.0 wt % Au.

28 Claims, 5 Drawing Sheets

$P_1, P_2$    end
$P_0$    center

< Use of Sn-Ag >

< Use of Sn-Zn >

< Use of Sn-Pb >

OPTICAL MODULE AND METHOD OF ASSEMBLING THE OPTICAL MODULE

TECHNICAL FIELD

The present invention relates to an optical module and a method of assembling the optical module, which have a good coupling efficiency with an optical fiber.

BACKGROUND ART

Semiconductor laser modules (which have a semiconductor laser, etc.) are usually employed as signal light sources for optical fiber communications, particularly trunk lines and cable television (CATV), or as pumping sources for optical fiber pumps. In order to realize high output and stable operation, such semiconductor laser modules have a semiconductor laser, a photodiode chip, optics such as a lens, a thermistor, etc., which are arranged at predetermined positions on a metal plate mounted on a thermo-control module capable of controlling temperature in dependence on the magnitude and direction of current conduction.

FIG. 8 shows a conventional semiconductor laser module having a thermo-control module incorporated therein. As shown in the figure, the semiconductor laser module 101 has a thermo-control module 103 mounted on the bottom plate 102 of the package through a lower joining solder portion 110. The thermo-control module 103 has a metal plate 105 mounted thereon. The metal plate 105 is provided with a carrier substrate 106, a semiconductor laser 107, a condensing lens 108, etc. The lower substrate 104a of thermo-control module 103 and the package bottom plate 102 are joined with the lower joining solder portion 110. The upper substrate 104b of the thermo-control module 103 and the metal plate 105 are joined with an upper joining solder portion 111. In the conventional semiconductor laser module, the lower substrate 104a of the thermo-control module 103 and the bottom plate 102 of the package are joined with solder consisting of an alloy of 63 wt % (weight-percent) Sn and 37 wt % Pb, and the lower joining solder portion 110 is formed. As shown in FIG. 1C, there is also a semiconductor laser module 1 having no internal thermo-control module.

However, the conventional optical module has the following disadvantages. That is, when joining the thermo-control module 103 and the package bottom plate 102 with solder, load is applied while melting the solder, but since the way of applying this load is not constant, the joining solder portion 110 is not uniform in thickness, as shown in FIG. 8. If the joining solder portion 110 is not uniform in thickness, it will be deformed due to a change in the temperature of the environment where the optical module is used, or a change in temperature when manufacturing the optical module. This deformation causes, for example, positional misalignment between the optical component 108 and optical fiber 109 optically aligned through the joining solder portion 110. As shown by an alternate long and short dash line, an error occurs in the axial alignment between the optical component 108 and the optical fiber 109 and causes a reduction in a coupling efficiency with an optical fiber and degradation of light output.

In addition, in a thin portion of the joining solder portion 110 (indicated by reference numeral 112), cracks are caused to occur in the joining solder portion 110 by thermal stress resulting from a difference in thermal expansion rate between joined members (e.g., the lower substrate 104a and bottom plate 102 in FIG. 8) during a change in temperature. As a result, a reduction in the joining strength and a change in the light coupling efficiency are caused. Furthermore, it is preferable to use lead-free solder that is environment-friendly.

The above-described conventional optical module is shown in Japanese Laid-Open Publication Nos. 2000-323731, 2000-280090, Hei 7-128550, and Hei 11-295560.

DISCLOSURE OF THE INVENTION

The present invention has been made in view of the above-described circumstances. Accordingly, it is the primary object of the invention to provide an optical module and an optical-module assembling method that use lead-free solder, suppress optical-axis misalignment by preventing deformation and cracks from occurring in solder portions, and have a good coupling efficiency with an optical fiber.

The inventors have made various investigations and experiments in order to solve the above-described problems and found the following facts. That is, if a thermo-control module and a package are joined with Sn—Ag solder or Sn—Zn solder, gold (Au) is diffused from the Au-plated layer formed on the package surface and the Au-plated layer on the surface of the bottom of the thermo-control module into Sn—Ag solder or Sn—Zn solder, and an approximately even phase is formed. As a result, deformation and cracks can be effectively prevented from occurring in solder portions, and optical-axis misalignment is difficult to occur.

More specifically, if a Sn—Ag alloy containing no lead is selected as a soldering material with which the thermo-control module and the package are joined, then the metal content of the alloy is set to a predetermined range, then pressure during solder joining is determined, and heating time is determined so the diffusion amount of Au from the Au-plated layer is constant, solder is approximately uniform in thickness and solidification is performed at a desired temperature. Therefore, the position of the thermo-control module becomes approximately constant and positioning of a metal plate mounting optical components thereon becomes easy. In addition, at high temperature (e.g., 70° C.), member misalignment due to the thermal expansion of solder is approximately constant, so optical-axis misalignment can be appreciably reduced compared with the above-described conventional optical module, and a reduction in light output can be suppressed.

The present invention has been based on the above-described facts found from various investigations and experiments. A first preferred form of the optical module of the present invention is an optical module comprising (1) at least one optical component; (2) a package for housing the aforementioned at least one optical component; and (3) a joining portion. The joining portion is formed within the package by Sn—Ag solder containing 2.0 to 5.0 wt % (weight-percent) Ag and further containing 2.0 to 20.0 wt % Au, or Sn—Zn solder containing 6.0 to 10.0 wt % Zn and further containing 2.0 to 20.0 wt % Au.

A second preferred form of the optical module of the present invention is an optical module comprising (1) at least one optical component; (2) a thermo-control module for temperature-controlling the aforementioned at least one optical component; (3) a package for housing the aforementioned at least one optical component and the thermo-control module; and (4) a joining portion. The joining portion is formed between the thermo-control module and the package, by Sn—Ag solder containing 2.0 to 5.0 wt % Ag and further containing 2.0 to 20.0 wt % Au, or Sn—Zn solder containing 6.0 to 10.0 wt % Zn and further containing 2.0 to 20.0 wt % Au.

A third preferred form of the optical module of the present invention is an optical module comprising (1) at least one optical component; (2) a thermo-control module for temperature-controlling the aforementioned at least one optical component; (3) a package for housing the aforementioned at least one optical component and the thermo-control module; and (4) a joining portion. The joining portion is formed between the thermo-control module and a base plate having the aforementioned at least one optical component mounted thereon, by Sn—Bi solder containing 10.0 to 60.0 wt % Bi.

In a fourth preferred form of the optical module of the present invention, the aforementioned Sn—Ag solder further contains 1.0 to 3.0 wt % Cu.

In a fifth preferred form of the optical module of the present invention, the aforementioned Sn—Ag solder further contains 1.0 to 10.0 wt % Bi.

In a sixth preferred form of the optical module of the present invention, the aforementioned Sn—Zn solder further contains 1.0 to 5.0 wt % Bi.

In a seventh preferred form of the optical module of the present invention, the aforementioned at least one optical component includes a semiconductor laser.

In an eighth preferred form of the optical module of the present invention, the aforementioned joining portion is 5 to 100 $\mu$m in thickness.

In a ninth preferred form of the optical module of the present invention, a difference in thickness between a front end (a1) and rear end (a2) of the joining portion in a direction parallel to a light emitting direction (A1-A2) of the package is 90 $\mu$m or less, and/or a difference in thickness between one end (b1) and the other end (b2) of the joining portion in a direction (B1-B2) perpendicular to the light emitting direction (A1-A2) is 90 $\mu$m or less.

In a tenth preferred form of the optical module of the present invention, the aforementioned joining portion has a gold (Au) diffused portion where Au is dispersed in the solder. The Au diffused portion is formed by diffusing Au from a gold (Au) plated layer of 1 to 5 $\mu$m in thickness previously formed in at least either a surface of the package joining with the thermo-control module or a surface of the thermo-control module joining with the package.

In an eleventh preferred form of the optical module of the present invention, the aforementioned Sn—Ag solder or Sn—Zn solder overflows from the joining portion between the thermo-control module and the package.

An twelfth preferred form of the optical module of the present invention is an optical module comprising (1) a carrier substrate mounting a semiconductor laser thereon; (2) a base plate mounting the carrier substrate thereon through a first joining solder portion; (3) a thermo-control module mounting the base plate thereon through a second joining solder portion, controlling temperature of the semiconductor laser, and comprising a Peltier element and upper and lower insulating substrates joined through a third joining solder portion; and (4) a package mounting the thermo-control module thereon through a fourth joining solder portion. When T1, T2, T3, and T4 are the melting points of the first, second, third, and fourth solder portions, T1$\geq$T2, T3$\geq$T4$\geq$T2, T3$\geq$240° C., and 280° C.$\geq$T4$\geq$190° C.

In a thirteenth preferred form of the optical module of the present invention, solder forming the third joining solder portion is composed of 80 wt % Au and 20 wt % Sn.

In a fourteenth preferred form of the optical module of the present invention, solder forming the third joining solder portion is a Bi—Sb alloy.

A first preferred form of the optical-module assembling method of the present invention is an optical-module assembling method comprising:

a preparation step of preparing a thermo-control module that has a gold (Au) layer on one surface thereof and temperature-controls at least one optical component, and a package that has a gold (Au) layer of 1 to 5 $\mu$m in thickness on one surface thereof and houses the aforementioned at least one optical component and the thermo-control module; and a solder joining step of joining the aforementioned one surface of the thermo-control module and/or the aforementioned one surface of the package by causing Au to be contained from the Au layer into Sn—Ag solder containing Ag in a range of 2.0 to 5.0 wt %, or Sn—Zn solder containing Zn in a range of 6.0 to 10.0 wt %.

A second preferred form of the optical-module assembling method of the present invention is an optical-module assembling method comprising:

a step of forming solder that joins a substrate of a thermo-control module and a bottom surface of a package, from a Sn—Ag alloy or a Sn—Zn alloy;

a step of forming solder that joins a bottom surface of a base plate having an LD chip and a lens mounted thereon and a top surface of the thermo-control module, from a Sn—Bi alloy;

a step of forming at least either a gold (Au) plated layer on the bottom surface of the base plate or a gold (Au) plated layer on the top surface of the thermo-control module to a thickness of 0.01 to 1 $\mu$m; and a step of joining the bottom surface of the base plate and the top surface of the thermo-control module.

In a third preferred form of the optical-module assembling method of the present invention, the aforementioned solder joining step performs joining by employing Sn—Ag solder foil, the Sn—Ag solder foil being larger than the aforementioned one surface of the thermo-control module and also being 5 to 100 $\mu$m in thickness.

In a fourth preferred form of the optical-module assembling method of the present invention, the aforementioned solder joining step further includes a pretreatment step of removing an oxidized film on a surface of the Sn—Ag solder, before joining is performed by employing the Sn—Ag solder foil.

In a fifth preferred form of the optical-module assembling method of the present invention, the aforementioned solder joining step previously coats the aforementioned one surface of the thermo-control module with the Sn—Ag solder or the Sn—Zn solder.

In a sixth preferred form of the optical-module assembling method of the present invention, the aforementioned solder joining step includes a step of heating the Sn—Ag solder or the Sn—Zn solder so that the time it is melting is between 5 and 120 seconds.

In a seventh preferred form of the optical-module assembling method of the present invention, the aforementioned heating step presses the aforementioned one surface of the package and the aforementioned one surface of the thermo-control module against each other with a load of 3.0$\times$10$^4$ Pa or less.

BRIEF DESCRIPTION OF THE DRAWINGS

The present invention will be described in further detail with reference to the accompanying drawings wherein.

BEST MODE FOR CARRYING OUT THE INVENTION

Figure 1A:
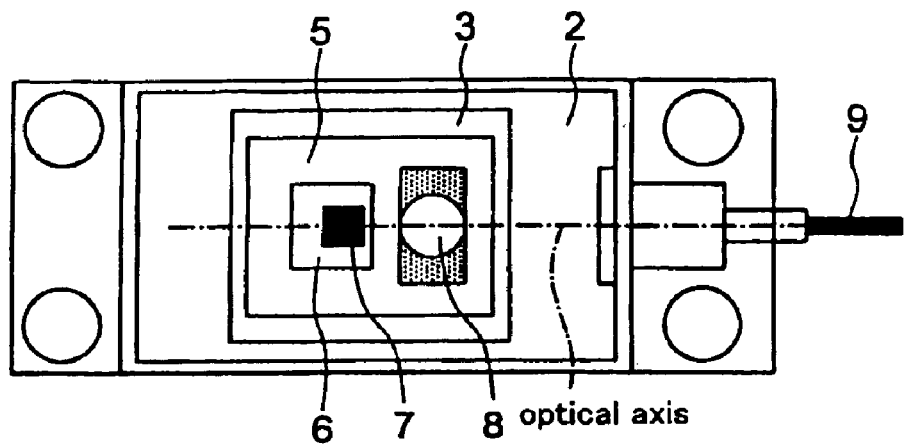
FIG. 1A is a top view showing an optical module constructed in accordance with the present invention.
Figure 1B:
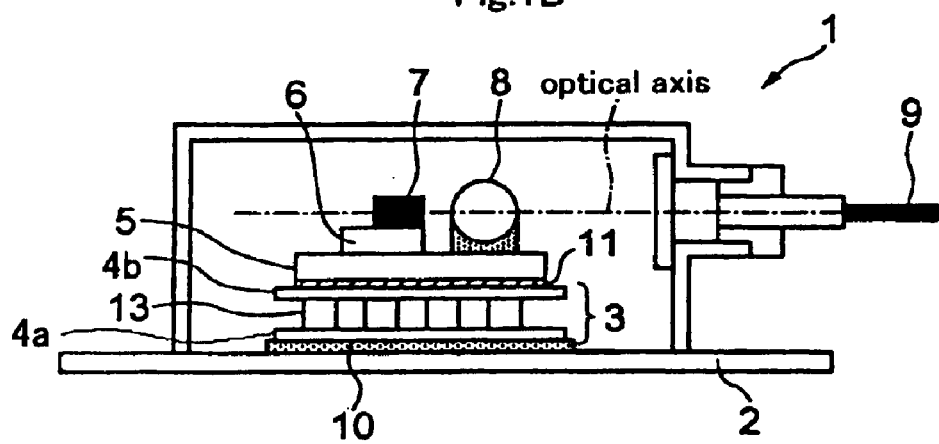
FIG. 1B is a side sectional view of the optical module shown in FIG. 1A.
Figure 1C:
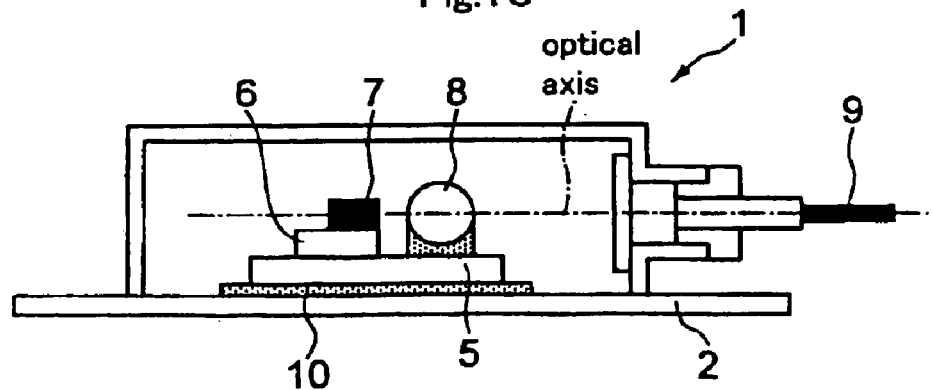
FIG. 1C is a side sectional view showing another optical module constructed in accordance with the present invention.

Referring now in greater detail to the drawings and initially to FIGS. 1A through 1C, there are shown optical modules constructed in accordance with the present invention. As shown in FIGS. 1A and 1B, the optical module 1 has a thermo-control module 3 mounted on the bottom plate 2 of the package through a lower joining solder portion 10. The thermo-control module 3 has a metal plate (base plate) 5 mounted thereon. The metal plate 5 has a carrier substrate 6 and a condensing lens 8 mounted thereon. The carrier substrate 6 has a laser diode 7, a thermistor, etc., mounted thereon. The thermo-control module 3 consists of a lower insulating substrate 4a, a Peltier element 13, and an upper insulating substrate 4b. The lower insulating substrate 4a of the thermo-control module 3 and the bottom plate 2 of the package are joined with the lower joining solder portion 10. The upper insulating substrate 4b of the thermo-control module 3 and the metal plate 5 are joined with an upper joining solder portion 11.

A preferred form of the optical module of the present invention is an optical module having at least one optical component and a package in which at least one optical component is packed. The optical module also has a joining portion formed from Sn—Ag solder consisting of 2.0 to 5.0 wt % Ag and Sn, or Sn—Zn solder consisting of 6.0 to 10.0 wt % Zn and Sn.

Another preferred form of the optical module of the present invention is an optical module having at least one optical component, a thermo-control module for temperature-controlling at least one optical component, and a package in which at least one optical component and thermo-control module are packed. The optical module also has a joining portion, formed from Sn—Ag solder consisting of 2.0 to 5.0 wt % Ag and Sn or from Sn—Zn solder consisting of 6.0 to 10.0 wt % Zn and Sn, between the thermo-control module and the package.

Sn—Ag solder and Sn—Zn solder are typically hard and they are difficult to deform. In the above-described preferred forms of the optical module of the present invention, the joining of optical components employs Sn—Ag solder containing 2.0 to 5.0 wt % Ag, preferably 3.0 to 3.5 wt % Ag, or Sn—Zn solder containing 6.0 to 10.0 wt % Zn, preferably 8.5 wt % Zn. Therefore, the joining solder portions are not liable to undergo plastic deformation, so the joining solder portions are prevented from being deformed due to a change in the temperature of the environment where the optical module is used, or a change in temperature during manufacture of optical modules. It has been found that Sn—Ag solder and Sn—Zn solder is greater in tensile strength than conventional Sn—Pb solder. That is, they are not easily deformed plastically by mechanical strain produced due to a change in environment temperature.

In the optical module of the present invention, the above-described Sn—Ag solder may contain Cu of 3 wt % or less. Cu has the property of lowering the melting point of solder.

Furthermore, in the optical module of the present invention, the above-described Sn—Ag solder may further contain Bi of 10.0 wt % or less. Moreover, in the optical module of the present invention, the above-described Sn—Zn solder may contain Bi of 5.0 wt % or less. Bi has the property of enhancing wettability of solder.

As set forth above, Cu has the property of lowering the melting point of solder, and Bi has the property of enhancing wettability of solder. In the above-described preferred forms of the optical module of the present invention, by adding Cu and Si to Sn—Ag solder, the wettability is enhanced and the occurrence of a void is suppressed. Similarly, by adding Bi to Sn—Zn solder, the wettability is enhanced.

In the optical module of the present invention, the above-described at least one optical component includes a semiconductor laser. Therefore, the optical axis of the semiconductor layer needs to be aligned with that of an optical fiber that is to be coupled with the optical module. In addition, the influence of optical-axis misalignment on module performance is great. Therefore, for instance, if a joining solder portion is not uniform in thickness by a change in temperature, optical-axis misalignment becomes greater and light output is reduced. Therefore, joining solder portions are also required to have high performance so optical-axis misalignment becomes smaller.

Note that as shown in FIG. 1C, the present invention is also applicable even when the semiconductor laser module 1 has no thermo-control module. In the optical module shown in FIG. 1C, the metal plate 5, which has the carrier substrate 6 and condensing lens 8 mounted thereon, is mounted directly on the package bottom plate 2 with solder. That is, the joining solder portion 10 is formed between the metal plate 5 and the package bottom plate 2.

Moreover, in the optical module of the present invention, the above-described joining solder portion (i.e., solder portion) is 5 to 100 μm in thickness. If the thickness of the joining solder portion is too thin (less than 5 μm), there is a possibility that mechanical stress due to deformation such as a warp in the package bottom plate will concentrate and therefore cracks will occur in the joining solder portion. On the other hand, if the thickness of the joining solder portion is too thick (great than 100 μm), it will be easily deformed plastically with small mechanical stress.

Thus, the thickness of the joining portion (solder portion) needs to be limited to a range of 5 to 100 μm.

FIG. 2 shows the thicknesses in predetermined directions of the joining solder portion. As the figure shows, a direction in which light is emitted from the package is represented by (A1-A2), and a direction perpendicular to the direction of (A1-A2) is represented as (B1-B2). For example, the thicknesses of solder just under the front and rear ends of the thermo-control module substrate 4a in the direction of (A1-A2) are represented as a1 and a2. Also, the thicknesses of solder just under both ends of the thermo-control module substrate 4a in the direction of (B1-B2) are represented as b1 (one end) and b2 (the other end). The solder thickness may be measured at positions determined from an arbitrary position on the package.

In addition, in the optical module of the present invention, the difference in thickness between the front end (a1) and rear end (a2) of the joining solder portion in the direction parallel to the light emitting direction (A1-A2) of the package is 90 µm or less, and/or the difference in thickness between one end (b1) and the other end (b2) of the joining solder portion in the direction (B1-B2) perpendicular to the light emitting direction (A1-A2) is 90 µm or less.

The thickness of the joining solder portion may be the maximum value or minimum value in the direction (B1-B2) of a1 and a2 and in the direction (A1-A2) of b1 and b2, or may be an average value of arbitrary points. Note that the thickness of the joining solder portion may adopt the maximum value or minimum value measured between the lower substrate of thermo-control module and the package bottom surface, or may adopt an average value (see FIG. 2B).

That is, if the difference in thickness between the front end (a1) and rear end (a2) of the joining solder portion in the direction parallel to the light emitting direction (A1-A2) of the package exceeds 90 µm, and/or the difference in thickness between one end (b1) and the other end (b2) of the joining solder portion in the direction (B1-B2) perpendicular to the light emitting direction (A1-A2) exceeds 90 µm, there is a problem that a deviation in member misalignment will occur due to the thermal expansion of solder at high temperature and therefore optical-axis misalignment will become great.

Figure 2A:
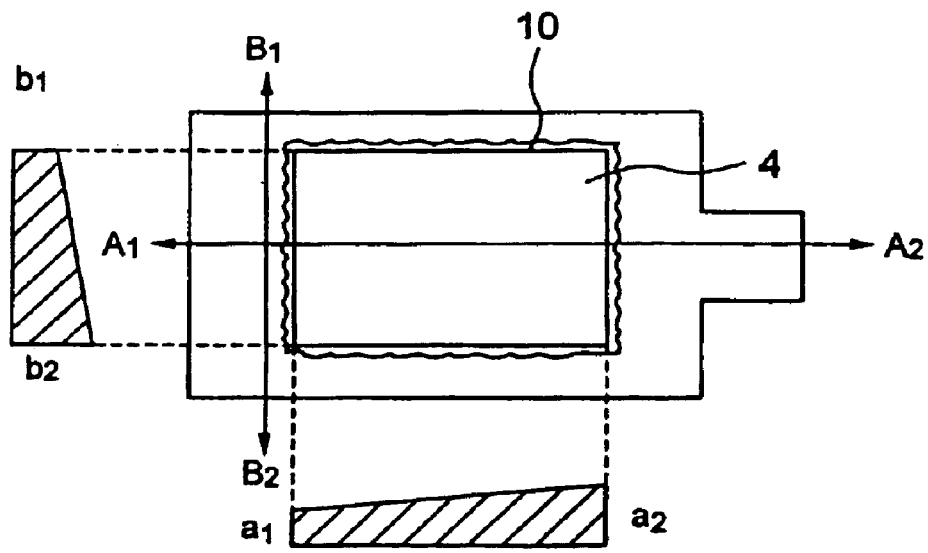
FIG. 2 is a diagram used to explain the thicknesses in predetermined directions of the joining portion shown in FIG. 1.
Figure 2B:
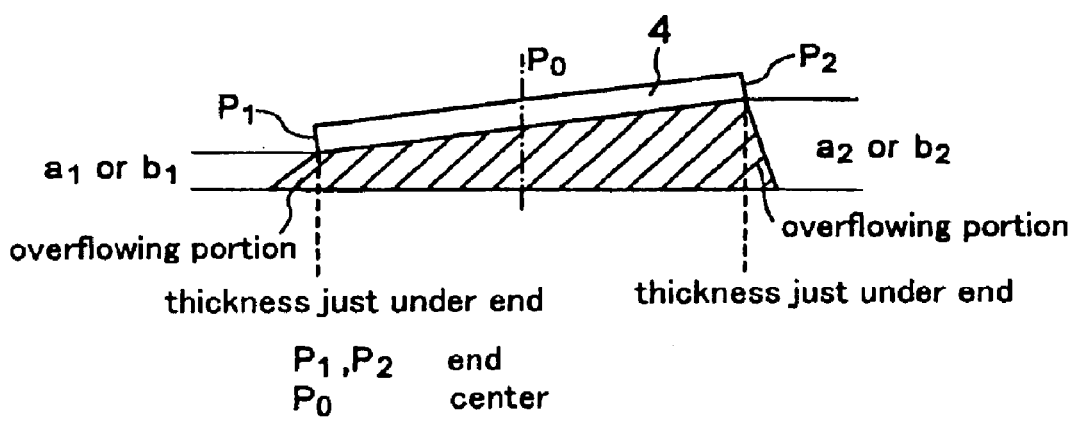

As shown in FIGS. 2A and 2B, by respectively controlling the difference in thickness between the front end (a1) and rear end (a2) of the joining solder portion in the direction (A1-A2) and the difference in thickness between one end (b1) and the other end (b2) of the joining solder portion in the direction (B1-B2) to predetermined values or less, the thermo-control module can maintain approximately its position even at high temperature. Therefore, alignment of optical components mounted on the thermo-control module becomes easier and member misalignment due to the thermal expansion of the joining solder portion becomes constant even at high temperature. Thus, optical-axis misalignment can be suppressed and a reduction in light output can be minimized.

In the optical module of the present invention, the joining solder portion contains 2.0 to 10.0 wt % Au. That is, preferably, 2.0 to 20.0 wt % Au is further contained in Sn—Ag solder and Sn—Zn solder. If the respective solders contain Au, compounds of Au and Sn ($Sn_4Au$, etc.) are evenly dispersed and the ductility of the joining solder portion becomes smaller, so creep deformation due to thermal stress can be prevented. If Au is less than 2.0 wt %, there is a problem that advantages by a reduction in the ductility cannot be sufficiently obtained. Also, if Au exceeds 2.0 wt %, the melting point of solder rises sharply and solidification occurs at a portion whose melting point has risen, so there is a problem that alignment operation will become worse.

In addition, in the optical module of the present invention, the joining solder portion is equipped with an Au-diffused portion where Au is dispersed in solder. The Au-diffused portion is formed by diffusing Au from an Au-plated layer of 1 to 5 µm in thickness previously formed in at least either the joining surface of the package with the thermo-control module or the joining surface of the thermo-control module with the package.

Figure 3A:
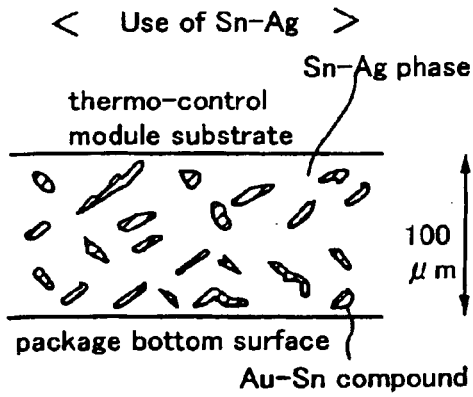
FIG. 3A is a diagram used to explain a joining solder portion equipped with an Au-diffused portion where Au is evenly dispersed in Sn—Au solder.
Figure 3B:
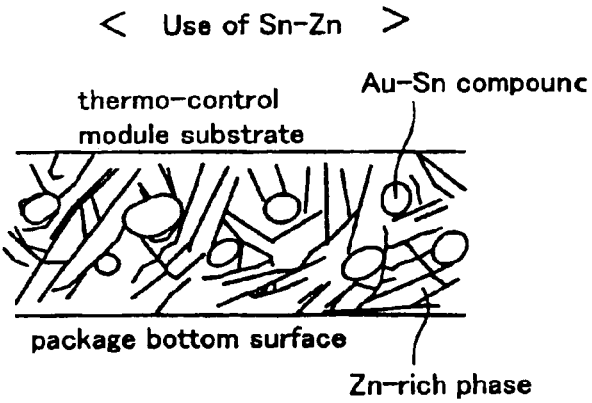
FIG. 3B is a diagram used to explain a joining solder portion equipped with an Au-diffused portion where Au is dispersed in Sn—Zn solder.
Figure 3C:
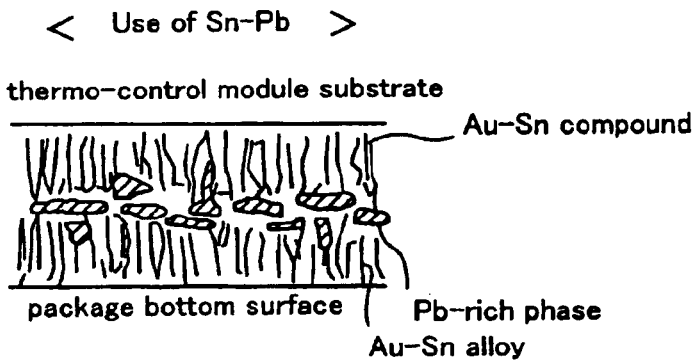
FIG. 3C is a diagram used to explain a joining solder portion equipped with an Au-diffused portion where Au is dispersed in conventional Sn—Pb solder.

FIG. 3 shows a joining solder portion equipped with an Au-diffused portion where Au is dispersed in solder. The case of Sn—Ag solder is shown in FIG. 3A. The case of Sn—Zn solder is shown in FIG. 3B, and the case of conventional Sn—Pb solder is shown in FIG. 3C.

As shown in FIG. 3A, in the joining solder portion of the present invention formed between the lower substrate of the thermo-control module and the bottom surface of the package, Au—Sn compounds ($Sn_4Au$, etc.) are diffused from Au-plated layers formed on the lower substrate of the thermo-control module and the bottom surface of the package and are evenly dispersed in a Sn—Ag alloy phase. For instance, in a joining solder portion with a thickness of 100 µm, structures ($Sn_4Au$, etc.) of about 5 to 10 µm in diameter are evenly dispersed and an even phase is formed as the entirety of the joining solder portion.

Similarly, as shown in FIG. 3B, Au—Sn compounds are diffused from Au-plated layers formed on the lower substrate of the thermo-control module and the bottom surface of the package and are evenly dispersed in a Sn—Ag alloy phase.

On the other hand, in the case of conventional Sn—Pb solder, as shown in FIG. 3C, Au is diffused from Au-plated layers formed on the lower substrate of the thermo-control module and the bottom surface of the package and forms an Au—Sn alloy phase. The Au—Sn alloy phase is formed from the upper and lower ends of the joining solder portion, and Pb-rich phases are concentrated in the central portion. Therefore, Pb-rich phases collect in the center, so an uneven phase is formed as the entirety of the joining solder portion.

In addition, the Pb-rich phases in the central portion deform with weak mechanical stress, so the joining solder portion is prone to creep. On the other hand, in a Sn—Ag alloy, Au is evenly dispersed and enhances mechanical strength, so creeping is suppressed and optical-axis misalignment is not prone to occur.

Also, in a Sn—Zn alloy, Au is evenly dispersed and enhances mechanical strength, so creeping is suppressed and optical-axis misalignment is less prone to occur.

Besides, if at least one of the two Au-plated layers, formed on the thermo-control module bottom surface and the package bottom surface or on the bottom surface of the metal plate and the top surface of the thermo-control module, is thin (0.01 to 1 µm), or if at least the Au-plated layer on the bottom surface of the metal plate is eliminated, the amount of Au diffusion into the solder alloy may be reduced.

Furthermore, in the case where solder for joining the lower substrate of the thermo-control module and the bottom surface of the package is a Sn—Ag alloy or Sn—Zn alloy, and solder for joining the bottom surface of the metal plate and the top surface of the thermo-control module is a Sn—Bi alloy, the amount of Au diffusion into the solder alloy may be reduced, if at least one of the two Au-plated layers, formed on the bottom surface of the metal plate and the top surface of the thermo-control module, is thin (0.01 to 1 µm), or if at least the Au-plated layer on the bottom surface of the metal plate is eliminated.

Now, a description will be given of an optical-module assembling method of the present invention.

The optical-module assembling method of the present invention has:

a preparation step of preparing a thermo-control module that has a gold (Au) layer on one surface thereof and temperature-controls at least one optical component, and a package that has a gold (Au) layer of 1 to 5 μm in thickness on one surface thereof and houses the aforementioned at least one optical component and the aforementioned thermo-control module; and a solder joining step of joining the aforementioned one surface of the thermo-control module and the aforementioned one surface of the package with Sn—Ag solder containing Ag in a range of 2.0 to 5.0 wt %, or Sn—Zn solder containing Zn in a range of 6.0 to 10.0 wt %.

Figure 4:
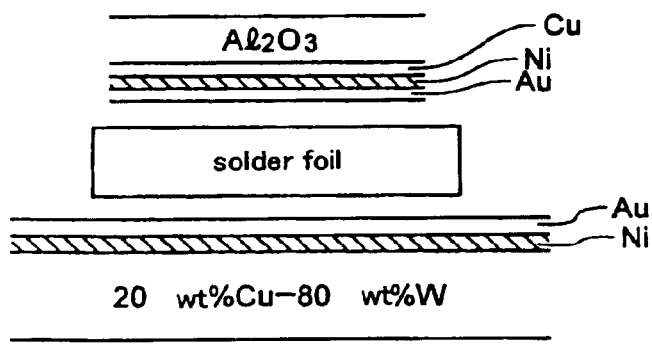
FIG. 4 is a diagram showing the relationship between the substrate of the thermo-control module, solder, and the bottom surface of the package.

FIG. 4 shows the relationship between the lower substrate of the thermo-control module, solder, and the bottom surface of the package. As the figure shows, the package has at least a Ni layer formed on the bottom surface consisting of 20 wt % Cu and 80 wt % W. The Ni layer has an Au layer of 1.5 to 2.0 μm in thickness formed on the surface thereof. The lower substrate of the thermo-control module has at least a Ni layer formed on alumina ($Al_2O_3$) or aluminum nitride (AlN). The Ni layer has an Au layer of 0.3 μm in thickness formed on the surface thereof. The lower substrate of the thermo-control module and the bottom surface of the package are arranged so the respective Au layers face each other. Between them, there is arranged solder foil of 50 to 80 μm in thickness.

That is, in a joining solder portion containing Au, if at least either a surface of the package to be joined to the thermo-control module or a surface of the thermo-control module to be joined to the package has an Au layer of 1 to 5 μm in thickness, Au can diffuse from the Au-plated layer into Sn—Ag solder or Sn—Zn solder when they are joined with the solder. If the joining surface is coated with an Au layer, the oxidization of a surface to be joined can be suppressed and the manufacturing step is simplified compared with the case where a solder alloy containing Au is employed. In addition, since solder containing Au from the beginning increases its mechanical strength, it is fairly difficult to roll the solder into foil. Thus, the assembling method of the present invention is capable of simplifying the manufacturing step and equipment.

When the thickness of the Au layer is less than 1 μm, ductility is not sufficiently reduced. Also, if the thickness of the Au layer exceeds 5 μm, an excessive rise in the melting point due to coupling of molten solder alloy and Au cannot be prevented.

In the optical-module assembling method of the present invention, the above-described solder joining step employs Sn—Ag solder foil to perform joining. The Sn—Ag solder foil is larger than a surface of the thermo-control module having the Au-plated layer formed thereon, and is 5 to 100 μm in thickness. In addition, solder is diffused along the Au-plated layer, so the thickness of the solder layer is prevented from varying significantly. By making the solder foil sufficiently larger than the substrate of the thermo-control module, positional misalignment is negligible in mounting the thermo-control module on the package bottom surface. Furthermore, if the solder thickness is within a range of 5 to 100 μm, cracks due to thermal stress are suppressed and creep deformation can be minimized.

In the optical-module assembling method of the present invention, the above-described solder joining step further includes the step of processing the surface of Sn—Ag solder foil before joining is performed with the Sn—Ag solder foil.

For example, by etching the surface of the Sn—Ag solder foil with an acid, an oxidized film on the solder surface can be removed, so wettability of the solder can be enhanced.

In addition, the etching process is not limited to acids. The oxidized film may be removed by chemical dry etching, mechanical polishing, etc.

In the optical-module assembling method of the present invention, the above-described solder joining step performs joining by previously coating a surface of the thermo-control module, which has an Au layer, with Sn—Ag solder or Sn—Zn solder.

That is, if the Au-plated layer is coated with solder, it becomes unnecessary to apply solder when joining. All that is required is to arrange the thermo-control module at a predetermined position, so the time and labor required for placing solder foil at a predetermined position can be saved.

In the optical-module assembling method of the present invention, the above-described solder joining step includes the step of heating Sn—Ag solder or Sn—Zn solder so that the time it is melting is between 5 and 120 seconds.

When the time solder is melting is less 5 seconds, Au plating does not melt sufficiently into the solder. Also, if the time solder is melting exceeds 120 seconds, molten solder cannot be prevented from advancing rapidly along the bottom surface of the package. That is, if the time solder is melting is too long, the solder and the gold plating on the bottom surface are alloyed and a deviation in melting point occurs. As a result, solidification occurs at a portion whose melting point is higher, and for example, a void is formed. Generally it is preferred to make the melting time of solder shorter. Preferably, the time solder is melting is 60 seconds or less.

In the optical-module assembling method of the present invention, the above-described heating step presses the Au-plated surface of the package and the Au-plated surface of the thermo-control module against each other with a load of $3.0 \times 10^4$ Pa or less.

That is, the solder foil supplied in the solder joining step is pressed with a load of $3.0 \times 10^4$ Pa or less and is heated. In this state, solder joining is performed while solder is being melted. Therefore, solder can be prevented from spreading out irregularly along a surface to be joined, when heated and pressed. As a result, the thickness of the Sn—Ag solder or Sn—Zn solder in a joining solder portion can be made approximately the same as solder foil supplied or solder previously coated. Thus, the thickness of solder can be easily controlled. In addition, it can be easily made uniform.

Furthermore, the optical module of the present invention is equipped with (1) a carrier substrate mounting a semiconductor laser thereon; (2) a base plate mounting the carrier substrate thereon through a first joining solder portion (A); (3) a thermo-control module mounting the base plate thereon through a second joining solder portion (B), controlling temperature of the semiconductor laser, and consisting of a Peltier element and upper and lower insulating substrates joined through a third joining solder portion (C); and (4) a package mounting the thermo-control module on a bottom surface thereof through a fourth joining solder portion (D). Assuming the melting points of the solder portions (A), (B), (C), and (D) are T1, T2, T3, and T4, $T1 \geq T2$ and $T3 \geq T4 \geq T2$. The melting point of the third solder portion (C) is $T3 \geq 240°$ C., and the melting point of the fourth solder portion (D) is $280°$ C. $\geq T4 \geq 190°$ C. The solder forming the third joining solder portion (C) may be composed of 80 wt % Au and 20 wt % Sn. The solder forming the third joining solder portion (C) may also be a Bi—Sb alloy.

According to the above-described preferred form of the present invention, the melting point of the solder within the thermo-control module is made higher. Therefore, the melting point of the solder for joining the thermo-control module and the package can be made higher. As a result, optical-axis misalignment due to a change in temperature is significantly reduced. And durability at high temperature is significantly enhanced, so reliability can be enhanced.

The optical module and the optical-module assembling method of the present invention will hereinafter be described in detail with reference to embodiments.

Embodiment 1

A package with a bottom surface plated with Au of thickness 1.5 µm, and a thermo-control module with a substrate of size 8 mm×8 mm and thickness 2 mm, were prepared. The substrate surface of the thermo-control module was plated with Au of thickness 0.2 µm.

Figure 5:
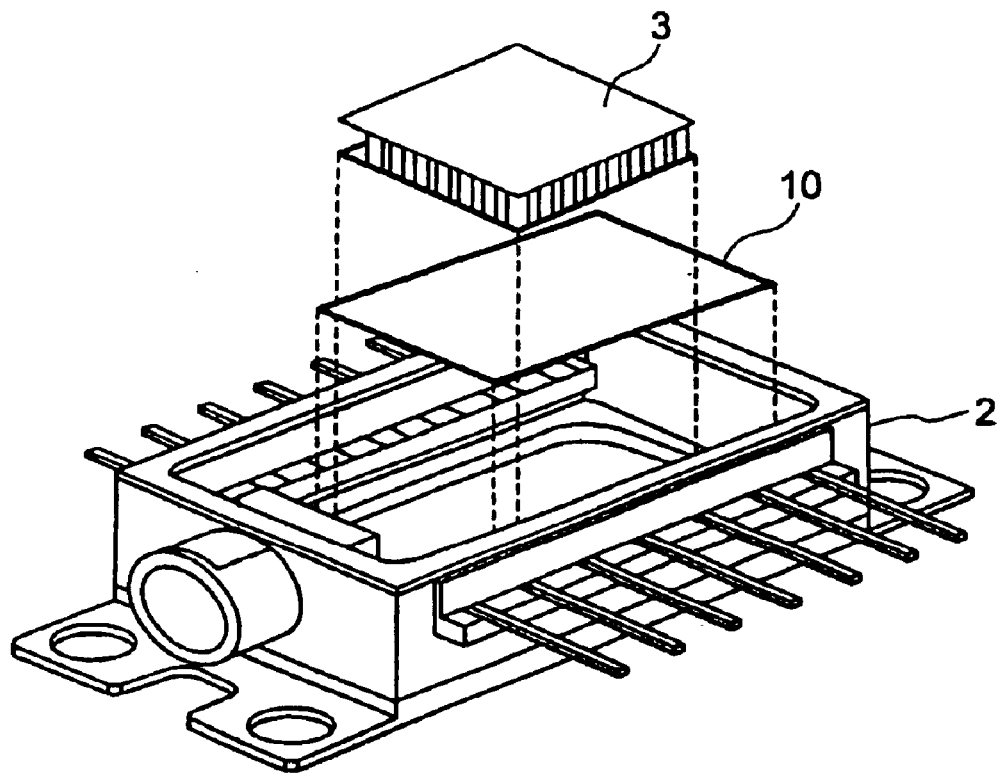
FIG. 5 is a diagram used for explaining a method of joining the thermo-control module to the package bottom surface with solder foil.

As shown in FIG. 5, a solder palette 10 (also called solder foil) with a size of 12 mm×8 mm×0.05 mm was used. It consists of Sn—0.3 wt % Ag—0.5 wt % Cu. With the Au-plated surfaces arranged to face each other, the package 2 and the thermo-control module were joined as follows.

That is, immediately before soldering, the solder palette 10 was immersed in hydraulic acid of 3% concentration for 10 minutes, and after removal of the oxidized film on the solder surface, it was washed in water. Thereafter, the package 2 was placed on a stage, the solder foil 10 was mounted on the central portion of the bottom plate of the package 2, and the thermo-control module 3 was stacked on the solder foil 10. Furthermore, a positioning jig with a weight of 5 g was placed on the top of the thermo-control module 3 in order to prevent the thermo-control module 3 from being moved greatly by solder when melted. (At this time, the load applied to the solder by the positioning jig of weight 5 g was $7.7 \times 10^2$ Pa. That is, since the weight of the jig is a predetermined value or less, the surface tension of the solder can maintain its original thickness, even when the solder is melted.)

Next, when the atmosphere was replaced with nitrogen and, for example, oxygen concentration was 100 ppm or less, the package 2 on the stage was heated. The peak temperature of the stage was set to 225° C., and the stage temperature was controlled so the time Sn—Ag—Cu solder is melting at the melting portion 217° C. or greater was 20 seconds. Since the melting time of the solder is short (20 seconds) and the thickness of the gold-plated film on the bottom plate of the package is thick (1.5 µm), the overflow of melted solder to the package bottom surface can be made very small. For that reason, the solder thickness of the joining solder portion is approximately the same as the original thickness of the solder palette 10. The thickness was 40 to 50 µm. (If the melting time is long, the amount that the solder overflows out is increased. Because of this, the solder is not uniform in thickness and a void is apt to occur.)

Preferably, the atmosphere is inert gas such as nitrogen, etc., or mixed gas, etc., and contains oxygen as little as possible.

From the observation of the cross section of the joining solder portion it has been confirmed that the gold plating in the package bottom surface and the gold plating in the thermo-control module have been molten into that solder portion. The gold content of the joining solder portion is about 8.0%. The ductility of the solder portion itself is reduced, so creep deformation due to thermal stress is difficult to occur.

Figure 6:
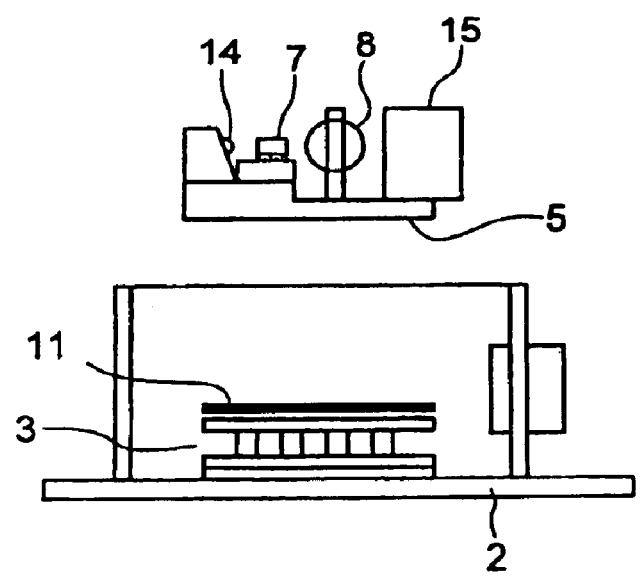
FIG. 6 is a diagram used for explaining a method of joining a base plate to the thermo-control module.
Figure 7:
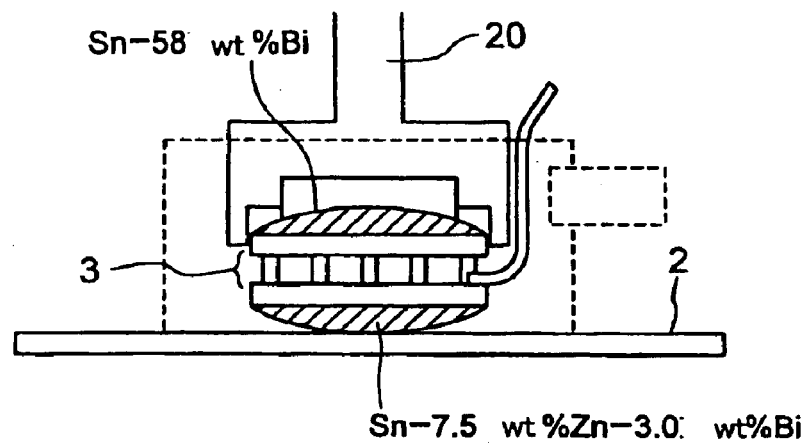
FIG. 7 is a diagram used for explaining another method of joining the thermo-control module in accordance with the present invention.
Figure 8:
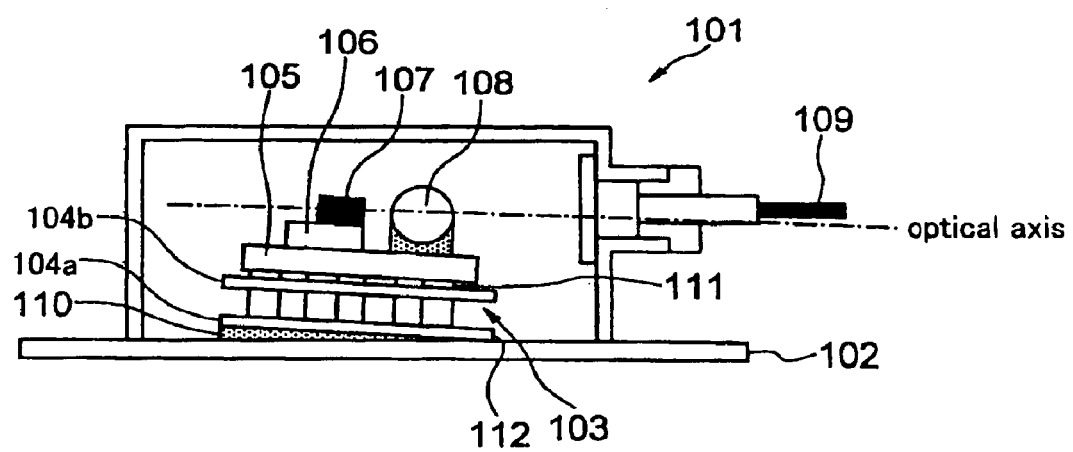
FIG. 8 is a diagram used for explaining a conventional optical module where solder is not uniform in thickness.

Thereafter, as shown in FIG. 6, a base plate 5 with a photo diode 14, an LD chip 7, a lens 8, and a polarizer 15 mounted thereon was joined on the top of the thermo-control module with solder. More specifically, Sn—Bi solder palette 11 was placed on the top surface of the thermo-control module 3, the base plate 5 was positioned, the package 2 was heated up to 175° C., the solder palette 11 was melted, and the base plate 5 was joined to thermo-control module 3.

Furthermore, an optical fiber was attached to the package, and the laser beam from the package was optically aligned with the axis of the optical fiber. In this way, an optical module was completed.

The optical module of the present invention thus assembled underwent a temperature cycle test (which repeats −40° C. to 85° C.) and a high-temperature shelf test (85° C.). As a result, in the temperature cycle test (which repeats −40° C. to 85° C.), while the degradation of the light output after 1000 cycles in the case of conventional Sn—Pb solder is an average of 8%, the degradation of the light output after 1000 cycles in the case of the present invention is an average of 4%. Thus, optical-axis misalignment due to a change in temperature is considerably reduced. In the high-temperature shelf test (85° C.), although the degradation of the light output after 2000 hours in the case of the conventional Sn—Pb solder is an average of 8%, the degradation of the light output after 2000 hours in the case of the present invention is an average of 3%. Thus, durability at high temperature is considerably enhanced and reliability is also enhanced.

Embodiment 2

In this embodiment, the substrate of a thermo-control module was previously coated. In the thermo-control module, the Peltier element and upper and lower insulating substrates were joined with solder consisting of 80 wt % Au and 20 wt % Sn. Also, the top surface (cooling surface) of the thermo-control module was previously coated with solder consisting of Sn, 57 wt % Bi, and 1.0 wt % Ag, and the thickness was 100 µm at the central portion. On the other hand, the bottom surface (heating surface) of the thermo-control module was previously coated with solder consisting of Sn, 7.5 wt % Zn, and 3.0 wt % Bi, and the thickness was 100 µm at the central portion. While the thermo-control module was being heated on a hot plate, a predetermined amount of solder was melted with a soldering iron, and the substrate was first coated with Sn—Zn—Bi solder whose temperature is high.

Also, coating may employ solder paste.

The thermo-control module was installed at the center of the bottom plate of the package, and they are positioned with a jig of weight 20 g. Thereafter, the package was put in a reflow furnace in the atmosphere of nitrogen, and solder was heated and joined. The temperature of the furnace was set so that the ultimate temperature of the package was 210° C., and the conveying speed within the furnace was set to 100 cm/min. For that reason, the time Sn—Zn—Bi solder is melting at 90° C. or greater was set to 30 seconds.

Next, the base plate, which includes a semiconductor laser and a lens, was joined on the top of the thermo-control module. The package was placed on a stage. And while causing the semiconductor laser to emit light, the base plate was moved with a base joining device and was arranged at a proper position within the package. With the base plate held at that position, the package was placed in the nitrogen atmosphere, and the stage was heated. The package was heated up to 170° C., only the Sn—Bi—Ag solder on the top surface of the thermo-control module was melted, and was joined with the base plate. Load was applied to the base plate with a pressing force of 20 g, and solder was melted for about 30 seconds. Thereafter, an optical fiber was attached to the package, and the laser beam from the package was optically aligned with the axis of the optical fiber. In this way, an optical module was completed.

INDUSTRIAL APPLICABILITY

The present invention is capable of providing an optical module and an optical-module assembling method that use lead-free solder, suppress optical-axis misalignment by preventing deformation and cracks from occurring in solder portions, and have a good coupling efficiency with an optical fiber.

What is claimed is:

1. An optical module comprising:
    at least one optical component;
    a package for housing said at least one optical component; and
    a joining portion formed within said package by Sn—Ag solder containing 2.0 to 5.0 wt % (weight-percent) Ag and further containing 2.0 to 20.0 wt % Au, or Sn—Zn solder containing 6.0 to 10.0 wt % Zn and further containing 2.0 to 20.0 wt % Au.
2. An optical module comprising:
    at least one optical component;
    a thermo-control module for temperature-controlling said at least one optical component;
    a package for housing said at least one optical component and said thermo-control module; and
    a joining portion formed between said thermo-control module and said package, by Sn—Ag solder containing 2.0 to 5.0 wt % Ag and further containing 2.0 to 20.0 wt % Au, or Sn—Zn solder containing 6.0 to 10.0 wt % Zn and further containing 2.0 to 20.0 wt % Au.
3. An optical module comprising:
    at least one optical component;
    a thermo-control module for temperature-controlling said at least one optical component;
    a package for housing said at least one optical component and said thermo-control module; and
    a joining portion formed between said thermo-control module and a base plate having said at least one optical component mounted thereon, by Sn—Bi solder containing 10.0 to 60.0 wt % Bi.
4. The optical module as set forth in claim 1, wherein said Sn—Ag solder further contains 1.0 to 3.0 wt % Cu.
5. The optical module as set forth in claim 4, wherein said Sn—Ag solder further contains 1.0 to 10.0 wt % Bi.
6. The optical module as set forth in claim 1, wherein said Sn—Zn solder further contains 1.0 to 5.0 wt % Bi.
7. The optical module as set forth in claim 1, wherein said at least one optical component includes a semiconductor laser.
8. The optical module as set forth in claim 1, wherein said joining portion is 5 to 100 μm in thickness.
9. The optical module as set forth in claim 1, wherein a difference in thickness between a front end (a1) and rear end (a2) of said joining portion in a direction parallel to a light emitting direction (A1-A2) of said package is 90 μm or less, and/or a difference in thickness between one end (b1) and the other end (b2) of said joining portion in a direction (B1-B2) perpendicular to said light emitting direction (A1-A2) is 90 μm or less.
10. The optical module as set forth in claim 1, wherein said joining portion has a gold (Au) diffused portion where Au is dispersed in said solder, said Au diffused portion being formed by diffusing Au from a gold (Au) plated layer of 1 to 5 μm in thickness previously formed in at least either a surface of said package joining with said thermo-control module or a surface of said thermo-control module joining with said package.
11. The optical module as set forth in claim 1, wherein said Sn—Ag solder or Sn—Zn solder overflows from said joining portion between said thermo-control module and said package.
12. An optical-module assembling method comprising:
    a preparation step of preparing a thermo-control module that has a gold (Au) layer on one surface thereof and temperature-controls at least one optical component, and a package that has a gold (Au) layer of 1 to 5 μm in thickness on one surface thereof and houses said at least one optical component and said thermo-control module; and
    a solder joining step of joining said one surface of said thermo-control module and/or said one surface of said package by causing Au to be contained from said Au layer into Sn—Ag solder containing Ag in a range of 2.0 to 5.0 wt %, or Sn—Zn solder containing Zn in a range of 6.0 to 10.0 wt %.
13. An optical-module assembling method comprising:
    a step of forming solder that joins a substrate of a thermo-control module and a bottom surface of a package, from a Sn—Ag alloy or a Sn—Zn alloy;
    a step of forming solder that joins a bottom surface of a base plate having an LD chip and a lens mounted thereon and a top surface of said thermo-control module, from a Sn—Bi alloy;
    a step of forming at least either a gold (Au) plated layer on the bottom surface of said base plate or a gold (Au) plated layer on the top surface of said thermo-control module to a thickness of 0.01 to 1 μm; and
    a step of joining the bottom surface of said base plate and the top surface of said thermo-control module.
14. The assembling method as set forth in claim 12, wherein said solder joining step performs joining by employing Sn—Ag solder foil, said Sn—Ag solder foil being larger than said one surface of said thermo-control module and also being 5 to 100 μm in thickness.
15. The assembling method as set forth in claim 14, wherein said solder joining step further includes a pretreatment step of removing an oxidized film on a surface of said Sn—Ag solder, before joining is performed by employing said Sn—Ag solder foil.
16. The assembling method as set forth in claim 12, wherein said solder joining step previously coats said one surface of said thermo-control module with said Sn—Ag solder or said Sn—Zn solder.
17. The assembling method as set forth in claim 12, wherein said solder joining step includes a step of heating said Sn—Ag solder or said Sn—Zn solder so that the time it is melting is between 5 and 120 seconds.
18. The assembling method as set forth in claim 17, wherein said heating step presses said one surface of said package and said one surface of said thermo-control module against each other with a load of $3.0 \times 10^4$ Pa or less.

19. An optical module comprising:

a carrier substrate mounting a semiconductor laser thereon;

a base plate mounting said carrier substrate thereon through a first joining solder portion;

a thermo-control module mounting said base plate thereon through a second joining solder portion, controlling temperature of said semiconductor laser, and comprising a Peltier element and upper and lower insulating substrates joined through a third joining solder portion; and a package mounting said thermo-control module thereon through a fourth joining solder portion;

wherein $T1 \geq T2$, $T3 \geq T4 \geq T2$, $T3 \geq 240°$ C., and $280°$ C. $\geq T4 \geq 190°$ C.

where T1, T2, T3, and T4 are the melting points of said first, second, third, and fourth solder portions, respectively.

20. The optical module as set forth in claim 19, wherein solder forming said third joining solder portion is composed of 80 wt % Au and 20 wt % Sn.

21. The optical module as set forth in claim 19, wherein solder forming said third joining solder portion is a Bi—Sb alloy.

22. The optical module as set forth in claim 3, wherein said at least one optical component includes a semiconductor laser.

23. The optical module as set forth in claim 3, wherein said joining portion is 5 to 100 μm in thickness.

24. The optical module as set forth in any one of claim 3, wherein a difference in thickness between a front end (a1) and rear end (a2) of said joining portion in a direction parallel to a light emitting direction (A1-A2) of said package is 90 μm or less, and/or a difference in thickness between one end (b1) and the other end (b2) of said joining portion in a direction (B1-B2) perpendicular to said light emitting direction (A1-A2) is 90 μm or less.

25. The optical module as set forth in claim 3, wherein said joining portion has a gold (Au) diffused portion where Au is dispersed in said solder, said Au diffused portion being formed by diffusing Au from a gold (Au) plated layer of 1 to 5 μm in thickness previously formed in at least either a surface of said package joining with said thermo-control module or a surface of said thermo-control module joining with said package.

26. The optical module as set forth in claim 3, wherein said Sn—Ag solder or Sn—Zn solder overflows from said joining portion between said thermo-control module and said package.

27. The assembling method as set forth in claim 13, wherein said solder joining step includes a step of heating said Sn—Ag solder or said Sn—Zn solder so that the time it is melting is between 5 and 120 seconds.

28. The assembling method as set forth in claim 27, wherein said heating step presses said one surface of said package and said one surface of said thermo-control module against each other with a load of $3.0 \times 10^4$ Pa or less.

* * * * *